United States Patent [19]

Yamaguchi et al.

[11] Patent Number: 4,878,957
[45] Date of Patent: Nov. 7, 1989

[54] DIELECTRICALLY ISOLATED SEMICONDUCTOR SUBSTRATE

[75] Inventors: Yoshihiro Yamaguchi, Urawa; Kiminori Watanabe, Kawasaki; Akio Nakagawa, Hiratsuka; Kazuyoshi Furukama, Kawasaki; Kiyoshi Fukuda; Katsujiro Tanzawa, both of Yokohama, all of Japan

[73] Assignee: Kabushiki Kaisha Toshiba, Kawasaki, Japan

[21] Appl. No.: 330,492

[22] Filed: Mar. 30, 1989

[30] Foreign Application Priority Data

Mar. 31, 1988 [JP] Japan .................................. 63-78714
Jul. 14, 1988 [JP] Japan ................................. 63-173701

[51] Int. Cl.⁴ ......................................... H01L 21/265
[52] U.S. Cl. ..................... 148/33.3; 357/60; 437/976; 437/974; 437/62; 437/921; 148/DIG. 17; 148/DIG. 159
[58] Field of Search .... 148/33.3, DIG. 12, DIG. 159; 437/976, 921, 62, 61

[56] References Cited

U.S. PATENT DOCUMENTS 4,638,552  1/1987  Shimbo ................................ 29/576
4,774,196  9/1987  Blanchard ........................... 437/24

FOREIGN PATENT DOCUMENTS 0232935  8/1987  European Pat. Off. .
2122148  6/1987  Japan .

OTHER PUBLICATIONS

Brooks, A. D., Donovan, R. P. "Low-Temperature Electrostatic Silicon-to-Silicon Seals Using Spittered Borosilicat Glass". J. Electrochem. Soc.: Solid State Science and Technology, Apr. 1972.

Primary Examiner—Brian E. Hearn
Assistant Examiner—Anthony Gutierrey
Attorney, Agent, or Firm—Oblon, Spivak, McClelland, Maier & Neustadt

[57] ABSTRACT

A dielectrically isolated semiconductor wafer substrate includes first and second semiconductive layers bonded to each other by a direct bonding technique in such a manner that an insulative layer is sandwiched therebetween. The first semiconductive layer is a first silicon layer having a (100) or (110) crystal surface orientation, while the second semiconductive layer is a second silicon layer having a (111) crystal surface orientation. Thereafter, a peripheral portion of the resultant substrate is removed, and a substrate of a slightly smaller size is obtained which is provided with an additionally formed new orientation flat.

5 Claims, 3 Drawing Sheets

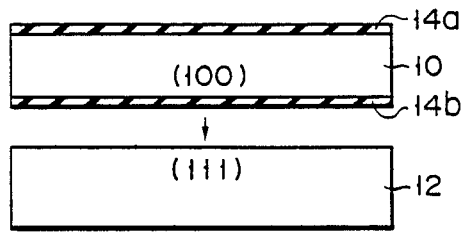
F I G. 1A
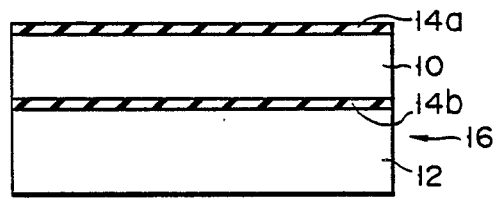
F I G. 1B
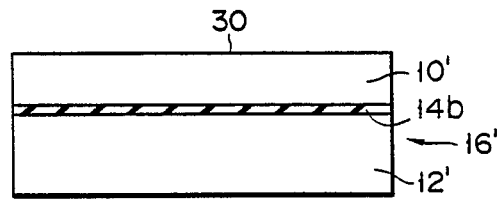
F I G. 1C
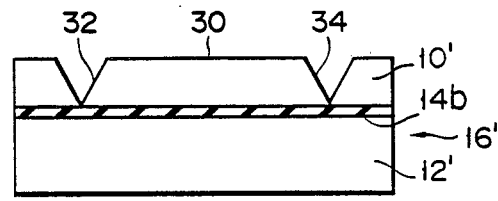
F I G. 1D
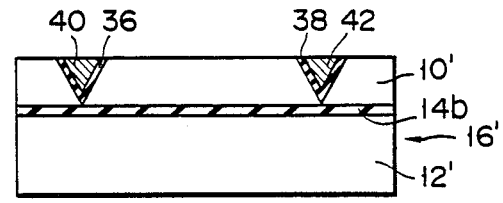
F I G. 1E

DIELECTRICALLY ISOLATED SEMICONDUCTOR SUBSTRATE

BACKGROUND OF THE INVENTION

1. Field of the Invention

The present invention relates to a semiconductor wafer direct bonding technique and, more particularly, to a pair of semiconductor wafers bonded to each other to have a dielectrically isolated structure, and a method of manufacturing the same.

2. Description of the Related Art

A technique for directly bonding a pair of semiconductor substrates such as silicon wafers to each other at a clean, mirror-polished surfaces thereof to provide an integrated wafer has been developed. This technique is well known as "Silicon-to-Silicon direct bonding technique". When this direct bonding technique is used, various types of semiconductor wafers can be fabricated. For example, when a silicon wafer having a resistivity of 1/1,000 $\Omega$.cm and a silicon wafer having a resistivity of several hundreds $\Omega$.cm are directly bonded to each other, a silicon wafer having a laminated structure of low- and high-resistivity semiconductor layers can be easily obtained. When one or both of these wafers to be bonded to each other are subjected to surface-oxidation, a wafer having a dielectrically isolated silicon laminated structure can be obtained.

When a dielectrically isolated silicon substrate is fabricated using the direct bonding technique, the following advantages can be obtained as compared with other isolation technologies such as p-n junction isolation, conventional dielectric isolation using a thick polysilicon body, and an SIMOX method wherein oxygen ions are implanted to inside the silicon bulk to form an oxide film therein. That is, (1) the quality of the silicon layer serving as an active layer can be kept to be excellent, (2) the thickness of the silicon layer can be artibrarily set, and (3) manufacturing processes can be relatively easily performed. Because of the above reasons, the above-mentioned "Silicon-to-Silicon direct bonding technique" is widely utilized for formation of a dielectrically isolated and directly bonded pair of silicon substrates having different characteristics.

The dielectrically isolated substrate fabricated by the direct bonding method, however, has the following problems. The first problem is a warp of bonded substrates. Two silicon substrates are directly bonded during a thermal treatment. When a substrate temperature returns to room temperature, a stress is generated between the silicon substrates and a silicon oxide film sandwiched therebetween due to a difference in thermal shrinkage. Since the thermal expansion coefficient of the silicon substrates is larger than that of the silicon oxide film, a shrinkage of the silicon substrates due to decrease in temperature is more considerable. As a result, at room temperature, a tensile stress is generated in the silicon substrates, while a compressive stress is generated in the silicon oxide film. In general, one silicon substrate on which circuit elements such as transistors are formed is polished so as to be thinner than the other silicon substrate serving as a support base layer. These facts result in warpage of the substrate structure. Such a warp in the directly bonded silicon substrates prevents effective execution of the following wafer manufacturing process such as a PEP process. In particular, as an increase in diameter of the wafer and miniaturization of circuit elements progress, the above problems become more serious.

The second problem is that it is difficult to achieve bonding of peripheral portions of the directly bonded semiconductor wafers without failure. Initially manufactured silicon wafers have poor parallel geometry in their peripheral portions. If two silicon substrates with such poor parallel geometry are bonded directly, incomplete bonding occurs in their peripheral portions, and their mechanical strength is decreased (particularly in the peripheral portion of a thinner wafer). The decrease in mechanical strength causes a problem that the wafer may be broken in the following circuit element formation steps.

In order to solve the above problems, it is necessary to remove a predetermined area of the incompletely bonded peripheral wafer portions, and to use only completely bonded central wafer portion. However, when the peripheral wafer portion is removed, an orientation flat formed therein is also removed. If no orientation flat is provided, accurate fabrication of element isolation V-shaped groove and integrated circuit patterns onto the wafer in the following steps cannot be performed.

SUMMARY OF THE INVENTION

It is therefore an object of the present invention to provide a new and improved dielectrically isolated and bonded semiconductor substrate having excellent basic characteristics, and a method of manufacturing the same.

In accordance with the above object, the present invention is addressed to a specific dielectrically isolated semiconductor substrate which includes first and second semiconductive layers bonded to each other in such a manner that an insulative layer is sandwiched therebetween. The first semiconductive layer is a first silicon layer having a (100) or (110) crystal surface orientation, while the second semiconductive layer is a second silicon layer having a (111) crystal surface orientation. With an arrangement of the above crystal surface orientations, when the first and second semiconductive layers are bonded to each other by a direct bonding technique, warps generated therein can be effectively suppressed. Thereafter, a peripheral portion of the resultant substrate is removed, and a substrate of a slightly smaller size which is provided with an additionally formed, new orientation flat can be obtained.

The present invention and its objects and advantages will become more apparent in a detailed description of a preferred embodiment to be presented hereinafter.

BRIEF DESCRIPTION OF THE DRAWINGS

In the detailed description of a preferred embodiment of the present invention presented below, reference is made to the accompanying drawings of which:

FIGS. 1A to 1E are diagrams showing main sectional views of main structures obtained in main processes for a method of manufacturing a dielectrically isolated and directly bonded silicon wafer according to a preferred embodiment of the present invention;

DETAILED DESCRIPTION OF THE PREFERRED EMBODIMENTS

Figure 2:
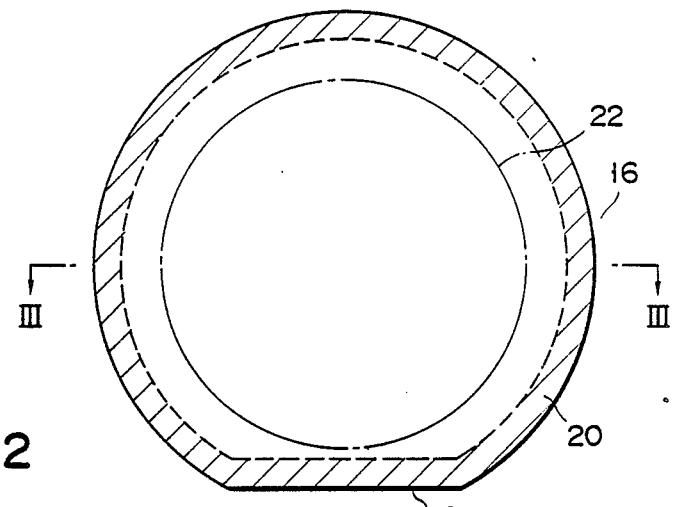
FIG. 2 is a diagram showing a plan view of a wafer obtained by directly bonding an initially prepared pair of silicon substrates.

Referring now to FIG. 1A, first, a pair of semiconductor wafers having mirror-polished surfaces and different characteristics are prepared. In this embodiment, a wafer 10 is a silicon substrate having an n-type conductivity, a resistivity of 20 to 30 $\Omega$.cm, and a diameter of 4 inches. A wafer 12 is a silicon substrate having a p-type conductivity, a resistivity of 0.01 to 0.02 $\Omega$.cm, and a diameter of 4 inches. The thickness of the silicon substrate 10 is 500 $\mu$m. Silicon oxide films 14a and 14b each having a thickness of 1 $\mu$m are formed on the upper and lower surfaces of the silicon substrate 10 by thermal oxidation. The thickness of the silicon substrate 12 is 500 $\mu$m.

It should be noted that the crystal surface orientation of the silicon substrate 12 is different from that of the silicon substrate 10: the surface orientation of the silicon substrate 10 is (100), and the surface orientation of the silicon substrate 12 is (111). These substrates 10 and 12 are bonded to each other through the insulating thin film 14b sandwiched therebetween using a direct bonding technique. Therefore, a bonded wafer substrate 16 shown in FIG. 1B is obtained. In FIG. 1A, in order to clearly show the difference between the crystal surface orientations of the substrates 10 and 12, reference numerals "(100)" and "(111)" are written for the sake of convenience.

First, the first and second silicon substrates 10 and 12 are subjected to a hydrophilic surface formation process. More specifically, these substrates 10 and 12 are cleaned by an $H_2SO_4$ - $H_2O_2$ solution mixture, aqua regio, or the like. Thereafter, the resultant substrates 10 and 12 are cleaned with water for about ten minutes, and are dried by a spinner. Thereafter, these substrates 10 and 12 are brought into direct contact with each other at their mirror-polished surfaces in a clean atmosphere at room temperature without the use of any bonding material. The bonding strength between the substrates 10 and 12 is further improved after they are thermally treated at a temperature of, e.g., 200° C. or more. The thermal treatment in this case may be carried out in an atmosphere of, e.g., oxygen, hydrogen, an inert gas, steam, or a mixture of these gases.

According to this embodiment, $H_2SO_4$ - $H_2O_2$ and HCl - $H_2O_2$ was used to clean the substrates 10 and 12. The thermal treatment for the substrates 10 and 12 was carried out in a nitrogen atmosphere containing a small amount of oxygen at a temperature of 1,100° C. for about two hours.

Figure 3:
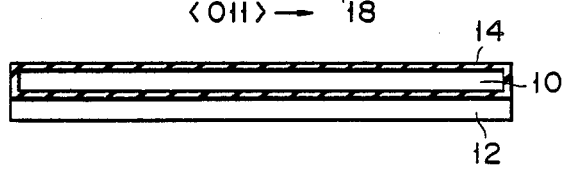
FIG. 3 is a diagram showing a sectional structure along the III—II of the wafer shown in FIG. 2.
Figure 4:
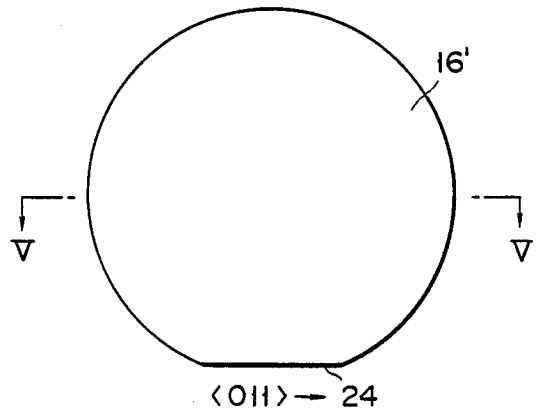
FIG. 4 is a diagram showing a plan view of a wafer of a slightly smaller size obtained by removing a peripheral portion of the wafer shown in FIG. 2.
Figure 5:
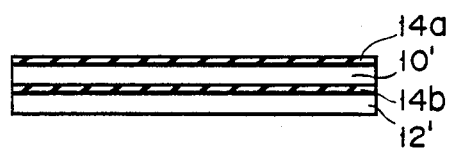
FIG. 5 is a diagram showing a sectional structure along the III—III of the wafer shown in FIG. 2.

The bonded silicon wafer 16 is subjected to an additional orientation flat formation process. More specifically, as shown in FIG. 2, the wafer 16 obtained by directly bonding the initially prepared pair of silicon substrates 10 and 12 has an orientation flat 18. The orientation flat 18 has a $<011>$ crystallographic axis. An entire sectional structure of the wafer 16 along the III-—III in this case is shown in FIG. 3. In a plan view of the wafer 16 in FIG. 2, a peripheral wafer portion 20 hatched for convenience tends to have poor bonding characteristics as compared with the central remaining portion of the wafer. After the substrates 10 and 12 are directly bonded, in order to remove the peripheral portion 20, the wafer 16 is cut along a virtual cutting line 22 and a wafer 16' of a slightly smaller size is obtained, as shown in FIG. 4. In this embodiment, the wafer 16' has a diameter of, e.g., 3 inches. In the wafer 16', a new orientation flat 24 is formed. This new orientation flat 24 has a $<011>$ crystallographic axis in the same manner as in the original orientation flat 18. The sectional structure of the wafer 16 along the V—V in this case is shown in FIG. 5.

When the new orientation flat 24 is formed in the cut wafer 16', before the peripheral portion 20 of the wafer 16 is removed, a line mark (not shown) parallel (or perpendicular) to the original orientation flat 18 is marked on the surface of the wafer 16. After the peripheral portion 20 of the wafer 16 is removed, the new orientation flat 24 is formed on the basis of the line mark. In this case, the deviation allowance of an offset from the reference crystallographic axis along a formation direction of the new orientation flat 24 is about ±5°.

Referring now to FIG. 1, after the above-mentioned additional orientation flat formation process is completed, a surface of a first silicon substrate 10' (which functions as an active layer) serving as a prospective element formation region of the wafer 16' is polished. As a result, the thickness of the silicon substrate 10' is decreased to 60 $\mu$m. At this time, the silicon substrate 10' has a polished top surface 30 from which the insulating thin film 14a is removed, as shown in FIG. 1C.

As shown in FIG. 1D, element isolation V-shaped grooves 32 and 34 are formed in the polished surface 30 of the first silicon substrate 10' by well-known anisotropic etching. Then, isolation insulating thin films 36 and 38 are respectively formed in the V-shaped grooves 32 and 34 by thermal oxidation or the like, as shown in FIG. 1E. Then, polysilicon layers are 40 and 42 are respectively buried in the grooves 32 and 34, and therefore, a dielectrically isolated substrate is completed.

According to a manufacturing technique of the present invention, the pair of silicon substrates 10 and 12 to be directly bonded have different crystal surface orientations: the silicon substrate 10 has a (100) surface orientation; and the silicon substrate 12 has a (111) surface orientation. Such a difference between the crystal surface orientations of the first and second substrates 10 and 12 effectively suppresses or prevents a warp in the peripheral portion 22 of the wafer 16 formed by directly bonding the substrates 10 and 12. The reason for this is as follows.

As described above, a cause of the warp of the dielectrically isolated substrate is a stress generated due to a difference between thermal expansion coefficients of the silicon and oxide film. A degree of the warp when a given stress is generated is determined in accordance with a Young's modulus and Poisson's ratio of a material which constitutes a substrate. In the case of a dielectrically isolated substrate, the Young's modulus and Poisson's ratio of the second silicon layer serving as a support base largely affect the degree of the warp, since the second layer is thinner than the other. In this case, a state of only a two-layered structure wherein a silicon oxide film is formed on a silicon substrate is considered. A warp X of this substrate is defined using the Young's modulus E, Poisson's ratio $v$, and proportion constant c of the silicon, as follows.

$$X = c \cdot (1-v)/E$$

In a silicon substrate having a (100) surface orientation, $E=1.31\times10^{12} dyn/cm^2$ and $v=0.28$. On the contrary, in a silicon substrate having a (111) surface orientation, $E=1.70\times10^{12} dyn/cm^2$, and $v=0.26$. The warp of the (100) silicon substrate is compared with that of the (111) silicon substrate in accordance with the above values. When the warp of the former substrate is "1", that of the latter substrate is "0.79". In other words, the warp of the (111) silicon substrate is smaller than that of the (100) silicon substrate. Thus, when the thick second silicon layer serving as a base has a (111) crystal surface orientation and the first silicon layer serving as an active layer has a (100) crystal surface orientation, the warp is smaller than the case wherein the surface orientations of both the first and second silicon layers are (100). When the first silicon layer has a (110) crystal surface orientation, the same effect can be obtained.

In particular, the above-mentioned function is important in a dielectrically isolated substrate obtained by a direct bonding technique. This is because, as described above, the surface orientation of the active layer is generally selected to be (100) for reasons associated with manufacturing processes and element design. However, in the direct bonding technique, the surface orientation of the second silicon layer can be selected not taking the surface orientation of the first silicon layer serving as an active layer into consideration. Even if a spin-on-glass bonding method, an anodic bonding method utilizing a voltage application, or the like is employed besides the direct bonding method to obtain a dielectrically isolated substrate, the same effect can be obtained, as a matter of course.

The present inventors manufactured some samples corresponding to the polished wafer 16' shown in FIG. 1C in practice, and an experiment was performed using the obtained samples. Warps in the peripheral portions of the samples were measured. As a result, in wafer samples having conventional arrangements wherein the surface orientation of the second silicon substrate 12 to be directly bonded to the first silicon substrate 10 is set to be the same as that of the first silicon substrate 10, i.e., (100), the warps in their peripheral portions fell within the range of 11.3 $\mu$m to 15.3 $\mu$m. The average value of the warps was 13.2 $\mu$m. On the contrary, the above-mentioned measurement was performed for experimental samples wherein the first and second substrates 10 and 12 had different surface orientations according to a concept of the present invention. As a result, the warps of the peripheral portions fell within the range of 8.4 $\mu$m to 10.3 $\mu$m, and the average value was 9.8 $\mu$m.

In addition, the present inventors manufactured some samples corresponding to the completed dielectrically isolated wafer shown in FIG. 1E in practice, and an experiment was performed using these samples. Warps in the peripheral portions of the samples were measured. As a result, in wafer samples having conventional arrangements wherein the surface orientation of the second silicon substrate 12 to be directly bonded to the first silicon substrate 10 is set to be the same as that of the first silicon substrate 10, i.e., (100), the warps in their peripheral portions fell within the range of 10.3 $\mu$m to 15.1 $\mu$m. The average value was 12.7 $\mu$m. On the contrary, the above-mentioned measurement was performed for experimental samples wherein the first and second substrates 10 and 12 had different surface orientations according to a concept of the present invention. As a result, the warps of the peripheral portions fell within the range of 8.0 $\mu$m to 10.0 $\mu$m, and the average value was 9.5 $\mu$m. These experimental results apparently demonstrate the superiority in warp prevention of the wafer obtained by the direct bonding manufacturing technique of the present invention. Thus, an increase in diameter of the direct bonding silicon wafer having the dielectrically isolated structure, and miniaturization of integrated circuit elements on this wafer substrate are facilitated.

Although the crystal surface orientation of the first silicon substrate 10 serving as an active layer is set to be (100) in this embodiment, the surface orientation may be (110). However, the (100) crystal surface orientation is preferably set in view of excellent basic characteristics of circuit elements when metal insulator semiconductor field effect transistors are formed on the substrate 10 as circuit elements.

According to the above embodiment, after the first and second substrates 10 and 12 are directly bonded, an outer circumferential surface region (which tends to be insufficiently or incompletely bonded even if the manufacturing technique of the present invention is employed, as described above) 22 of the integrated wafer 16 is removed. This removal allows an improvement of the physical strength of the peripheral portion of the dielectrically isolated direct bonding wafer 16' to be finally obtained. The ground wafer 16' is provided with a new orientation flat 24 by an additional orientation flat formation process. This new orientation flat allows effective formation of the integrated circuit patterns on the dielectrically isolated direct bonding wafer 16' to be finally obtained.

Although the invention has been described with reference to a specific embodiment (specific embodiments), is shall be understood by those skilled in the art that numerous modifications may be made that are within the spirit and scope of the invention.

Figure 6A:
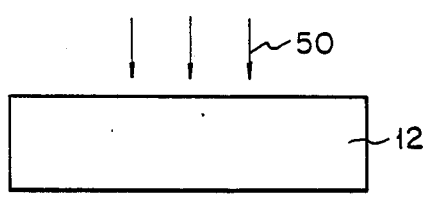
FIGS. 6A to 6B are diagrams showing main sectional views of main structures obtained in main processes of a modification of the manufacturing method of the dielectrically isolated and directly bonded silicon wafer shown in FIG. 1.
Figure 6B:
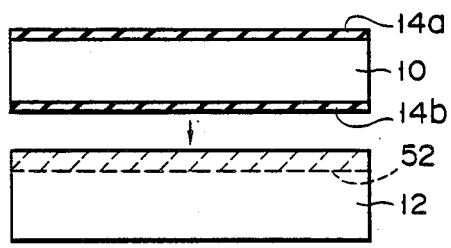

For example, when a dielectrically isolated wafer is formed by directly bonding a pair of silicon substrates 10 and 12, in order to suppress generation of a warp between the substrates 10 and 12, the impurity concentration of silicon substrate 12 may be partially increased. When the impurity concentration of the silicon substrate 12 is partially increased, the impurity concentration in a partial region including at least a surface region (a surface to be bonded) subjected to direct bonding is increased. More specifically, before the direct bonding process, impurities are doped in at least the surface portion to be bonded of the silicon substrate 12 by a doping technique such as diffusion, as indicated by arrows 50 in FIG. 6A. As a result, as shown in FIG. 6B, the impurity concentration of a surface portion 52 of the silicon substrate 12 is increased. Thereafter, when the direct bonding processing is performed, generation of the warp of the dielectrically isolated wafer 16' can be effectively suppressed.

Figure 7A:
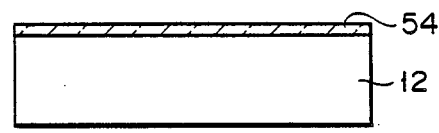
FIGS. 7A and 7B are diagrams showing main sectional views of main structures obtained in main processes of another modification of the manufacturing method of the dielectrically isolated and directly bonded silicon wafer shown in FIG. 1.
Figure 7B:
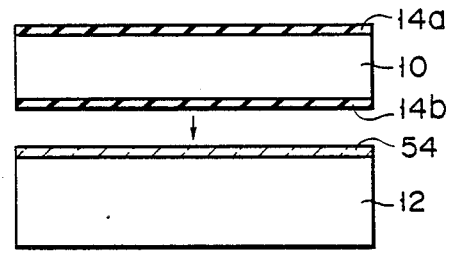

Alternatively, as shown in FIG. 7A, a BPSG (Boron-phosphorus silicate glass) layer 54 is formed on the bonding surface of the silicon substrate 12 before the substrates are subjected to direct bonding, so that generation of warp in the dielectrically isolated wafer 16' can be effectively suppressed. In this case, the BPSG layer 54 serves to suppress its warp and distortion of substrate 12. Thereafter, as shown in FIG. 7B, when the direct bonding processing is performed, warp generation in the dielectrically isolated wafer 16' can be effectively suppressed.

What is claimed is:

1. A semiconductor substrate comprising:
 (a) a first semiconductive layer;
 (b) a second semiconductive layer; and
 (c) an insulative layer sandwiched between said first and second semiconductive layers, said first semiconductive layer being a first silicon layer having a (100) or (110) crystal surface orientation, and said second semiconductive layer being a second silicon layer having a (111) crystal surface orientation.

2. The substrate according to claim 1, wherein said first silicon layer serves as an active layer on which integrated circuit elements are formed, while said second silicon layer serves as a base layer for supporting said active layer.

3. The substrate according to claim 2, wherein said insulative layer includes a silicon oxide thin film.

4. The substrate according to claim 3, wherein said first and second silicon layers bonded to each other are provided with a peripheral portion which is removed after said first and second silicon layers are bonded.

5. The substrate according to claim 4, wherein said first and second silicon layers are provided with an additionally formed orientation flat.

* * * * *

UNITED STATES PATENT AND TRADEMARK OFFICE
CERTIFICATE OF CORRECTION

PATENT NO. : 4,878,957
DATED : 11/7/89
INVENTOR(S) : Yoshihiro Yamaguchi et al

It is certified that error appears in the above-identified patent and that said Letters Patent is hereby corrected as shown below:

Title page:

The fourth inventor's last name is misspelled. It should be --Kazuyoshi Furukawa--

Signed and Sealed this

Fifth Day of February, 1991

*Attest:*

HARRY F. MANBECK, JR.

*Attesting Officer*     *Commissioner of Patents and Trademarks*